United States Patent
Chen (10) Patent No.: US 10,672,736 B1
(45) Date of Patent: Jun. 2, 2020

(54) METHOD OF LIQUID ASSISTED MICRO COLD BINDING

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 16/371,136

(22) Filed: Apr. 1, 2019

(51) Int. Cl.
*H01L 23/00* (2006.01)
*H01L 21/48* (2006.01)
*H01L 33/62* (2010.01)

(52) U.S. Cl.
CPC .......... *H01L 24/89* (2013.01); *H01L 21/4853* (2013.01); *H01L 33/62* (2013.01); *H01L 24/08* (2013.01); *H01L 2224/08225* (2013.01); *H01L 2224/808* (2013.01); *H01L 2224/8019* (2013.01); *H01L 2224/80048* (2013.01); *H01L 2224/80201* (2013.01); *H01L 2224/80409* (2013.01); *H01L 2224/80494* (2013.01); *H01L 2933/0066* (2013.01)

(58) Field of Classification Search
None
See application file for complete search history.

(56) References Cited

U.S. PATENT DOCUMENTS

| 10,312,218 B1 * | 6/2019 | Chen .................. H01L 33/62 |
| 2015/0130069 A1 * | 5/2015 | Mahajan ........... H01L 21/76879 257/773 |
| 2017/0086320 A1 * | 3/2017 | Barber .................. H01L 24/83 |

\* cited by examiner

*Primary Examiner* — J. E. Schoenholtz
(74) *Attorney, Agent, or Firm* — CKC & Partners Co., Ltd.

(57) ABSTRACT

A method of liquid assisted micro cold binding is provided. The method includes: forming a conductive pad on the substrate in which the conductive pad consists essentially of indium; forming a liquid layer on the conductive pad; placing a micro device having an electrode facing the conductive pad over the conductive pad such that the micro device is in contact with the liquid layer and is gripped by a capillary force produced by the liquid layer between the micro device and the conductive pad in which the electrode consists essentially of indium; and evaporating the liquid layer such that the electrode is bound to the conductive pad and is in electrical contact with the conductive pad.

20 Claims, 15 Drawing Sheets

METHOD OF LIQUID ASSISTED MICRO COLD BINDING

BACKGROUND

Field of Invention

The present disclosure relates to a method for binding a micro device to at least one conductive pad.

Description of Related Art

The statements in this section merely provide background information related to the present disclosure and do not necessarily constitute prior art.

In recent years, micro devices have become popular in various applications. Among all technical aspects of micro devices, transfer process is one of the most challenging tasks for micro devices to be commercialized. One of the important issues of the transfer process is bonding the micro devices to a substrate.

SUMMARY

According to some embodiments of the present disclosure, a method of liquid assisted micro cold binding is provided. The method includes: forming a conductive pad on the substrate in which the conductive pad consists essentially of indium; forming a liquid layer on the conductive pad; placing a micro device having an electrode facing the conductive pad over the conductive pad such that the micro device is in contact with the liquid layer and is gripped by a capillary force produced by the liquid layer between the micro device and the conductive pad in which the electrode consists essentially of indium; and evaporating the liquid layer such that the electrode is bound to the conductive pad and is in electrical contact with the conductive pad.

According to some embodiments of the present disclosure, a method of liquid assisted micro cold binding is provided. The method includes: forming a conductive pad on the substrate in which the conductive pad consists essentially of indium; placing a micro device including an electrode facing the conductive pad on the conductive pad such that the micro device is in contact with the conductive pad in which the electrode consists essentially of indium; forming a liquid layer on the micro device and the substrate after said placing, such that a part of the liquid layer penetrates between the micro device and the conductive pad, and the micro device is gripped by a capillary force produced by said part of the liquid layer; and evaporating the liquid layer such that the electrode is bound to the conductive pad and is in electrical contact with the conductive pad.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "in an embodiment" or the like in various places throughout this specification are not necessarily referring to the same embodiment of the invention. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Figure 1:
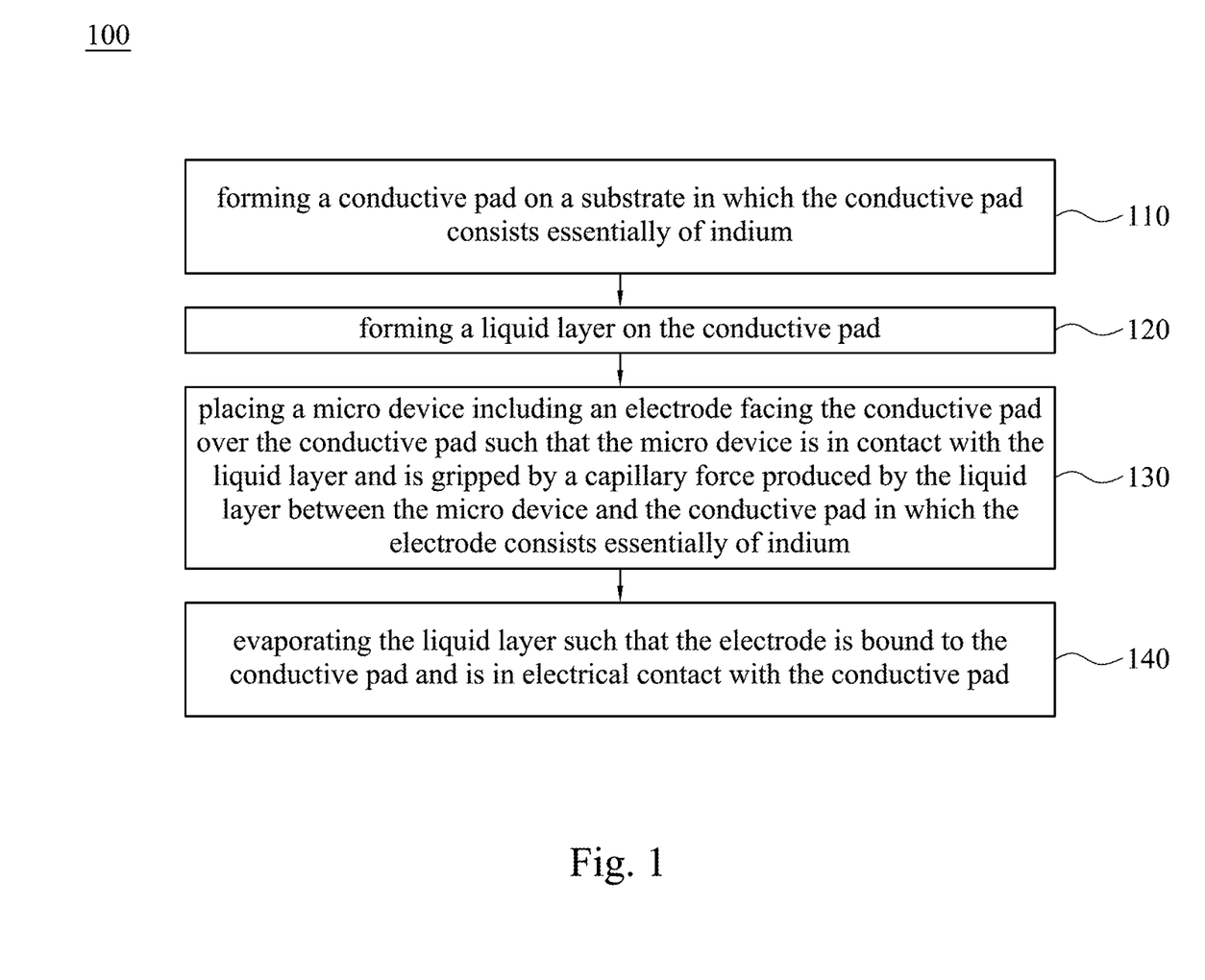
FIG. 1 is a flow chart of a method of liquid assisted micro cold binding according to some embodiments of the present disclosure.
Figure 2A:
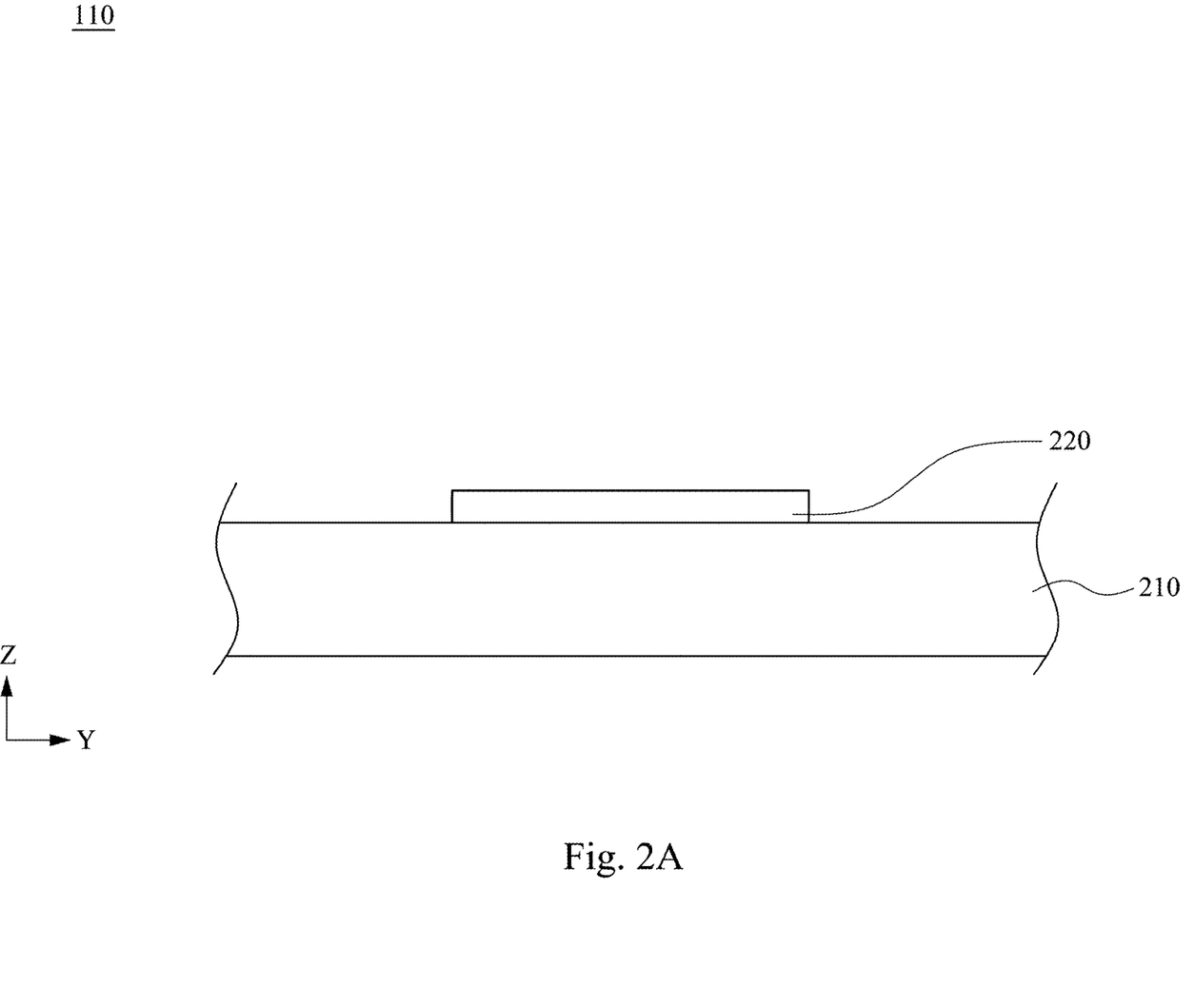
FIG. 2A is a schematic cross-sectional view of an intermediate stage of the method according to one embodiment of the present disclosure.
Figure 2B:
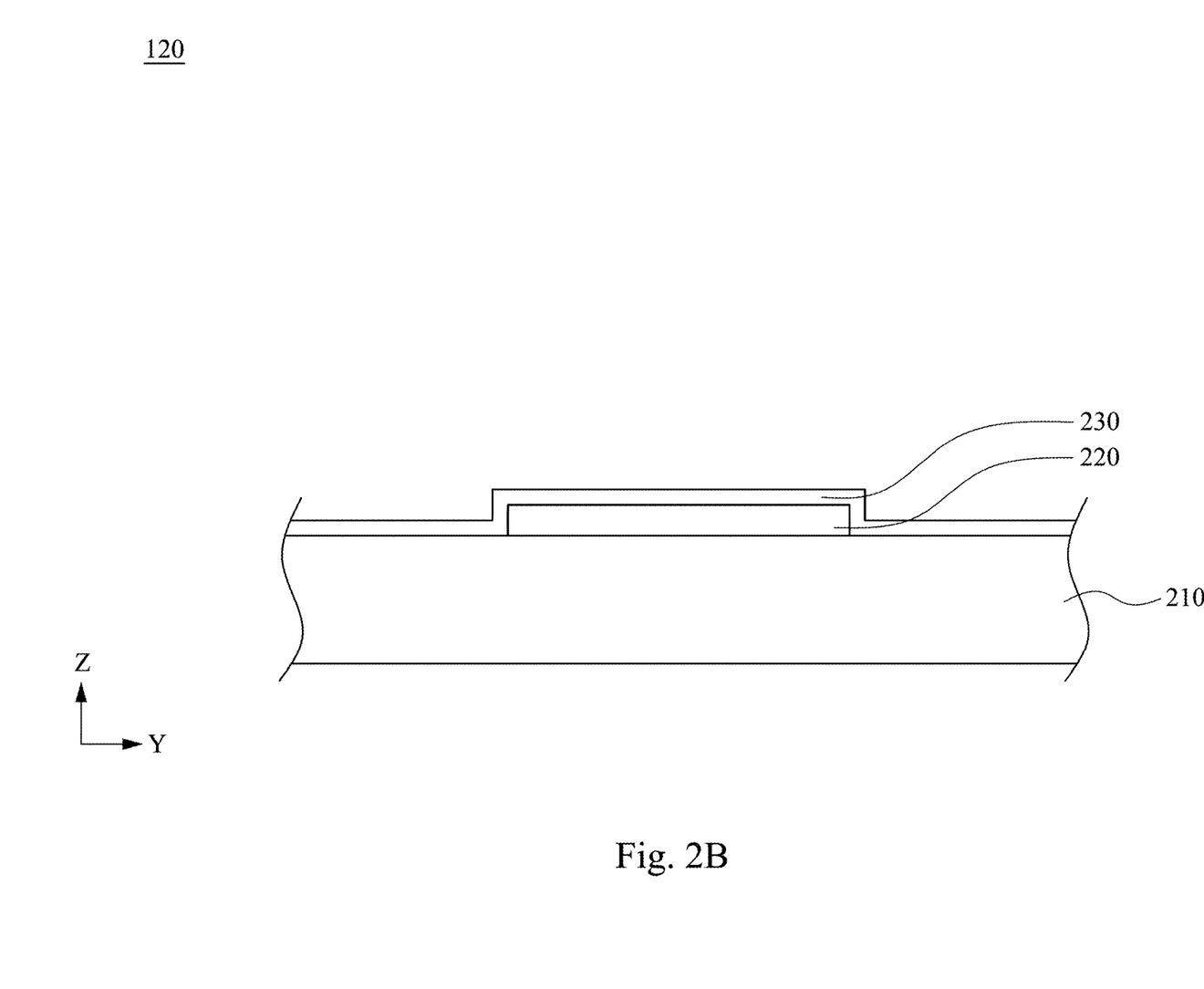
FIG. 2B is a schematic cross-sectional view of an intermediate stage of the method according to one embodiment of the present disclosure.
Figure 2C:
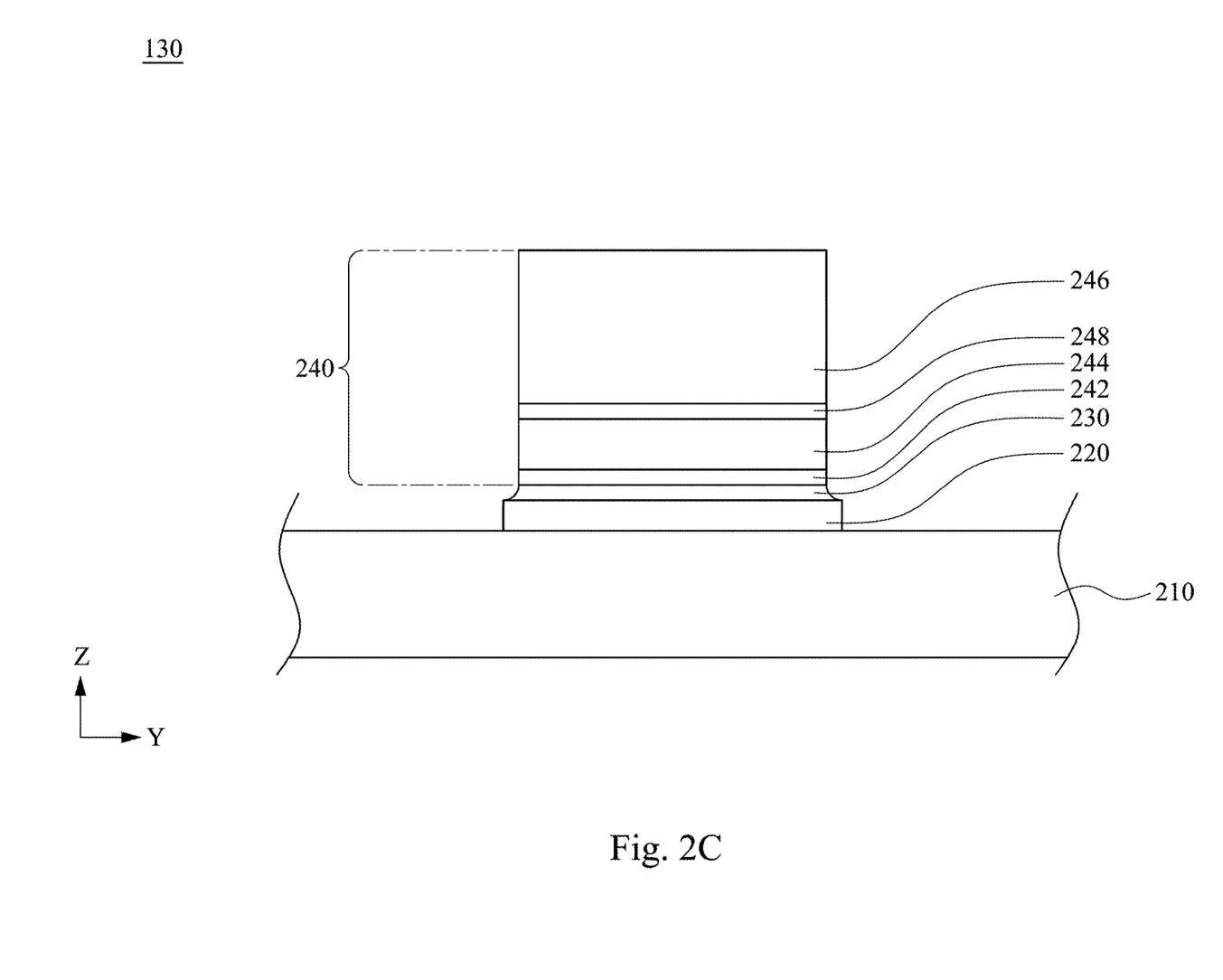
FIG. 2C is a schematic cross-sectional view of an intermediate stage of the method according to one embodiment of the present disclosure.
Figure 2D:
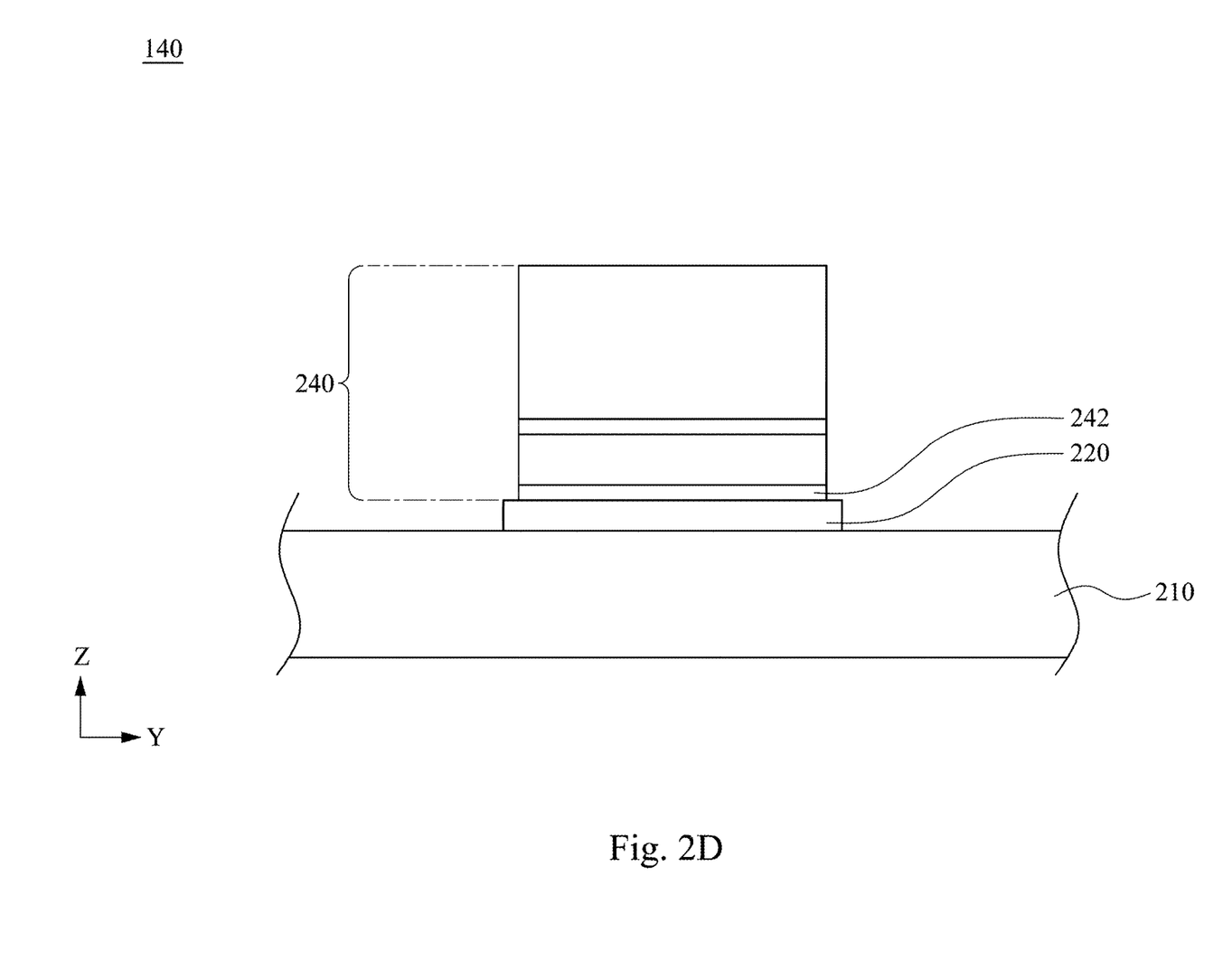
FIG. 2D is a schematic cross-sectional view of an intermediate stage of the method according to one embodiment of the present disclosure.

Reference is made to FIGS. 1 to 2D. FIG. 1 is a flow chart of a method 100 of liquid assisted micro cold binding according to some embodiments of the present disclosure. FIGS. 2A to 2D are schematic cross-sectional views of intermediate stages of the method of FIG. 1. The method begins with operation 110 in which a conductive pad 220 is formed on a substrate 210 (as referred to FIG. 2A). The method continues with operation 120 in which a liquid layer 230 is formed on the conductive pad 220 of the substrate 210 (as referred to FIG. 2B). The method continues with operation 130 in which the micro device 240 including an electrode 242 facing the conductive pad 220 is placed over the conductive pad 220 such that the micro device 240 is in contact with the liquid layer 230 (as referred to FIG. 2C). The method continues with operation 140 in which the liquid layer 230 is evaporated (as referred to FIG. 2D).

Reference is made to FIG. 2A in which the conductive pad 220 is formed on the substrate 210. The conductive pad 220 consists essentially of indium. In some embodiments, a thickness of the conductive pad 220 is smaller than or equal to 2 μm. In some embodiments, a thickness of the conductive pad 220 is smaller than or equal to 0.5 μm.

Reference is made to FIG. 2B in which the liquid layer 230 is formed on a conductive pad 220 of the substrate 210. In some embodiments, the formation of the liquid layer 230 is achieved by adjusting a temperature of the conductive pad 220 or the substrate 210 in an environment including a vapor to a selected temperature point such that a part of the vapor is condensed to form the liquid layer 230 on the conductive pad 220. In some embodiments, the selected temperature point is a dew point such that a water vapor in the environment is condensed to form liquid water, i.e., the liquid layer 230. In some other embodiments, the formation of the liquid layer 230 may also be achieved by gas showering, inkjet printing, roller coating, dip coating, or the like.

Reference is made to FIG. 2C in which the micro device 240 is placed over the conductive pad 220 such that the micro device 240 is in contact with the liquid layer 230. The meniscus of the liquid layer 230 is caused by a capillary force. The micro device 240 is gripped by the capillary force produced by the liquid layer 230 between the micro device 240 and the conductive pad 220. In some embodiments, a thickness of the liquid layer 230 between the micro device 240 and the conductive pad 220 is less than a thickness of the micro device 240 when the micro device 240 is gripped by the capillary force. In some embodiments, a lateral length of the micro device is less than or equal to about 100 μm. Said lateral length is measured in a direction Y. The direction Y is perpendicular to a thickness direction Z, and the thickness direction Z is perpendicular to a planar extension direction of the substrate 210. In some embodiments, the micro device 240 is picked up from a carrier substrate and then placed over the conductive pad 220 by a transfer head. The transfer head may exert a pressure on the micro device 240 for picking-up by vacuum, adhesion, magnetic, electrostatic attraction, or the like. In some embodiments, the micro device 240 is a micro light-emitting diode (pLED), but should not be limited thereto. In some embodiments, the micro device 240 mainly includes the electrode 242 facing the conductive pad 220, a first type semiconductor layer 244, and a second type semiconductor layer 246 joined with the first type semiconductor layer 244 through an active layer 248. The first type semiconductor layer 244 is between the second type semiconductor layer 246 and the electrode 242. In some embodiments, a thickness of the electrode 242 ranges from about 0.2 μm to about 10 μm.

Reference is made to FIG. 2D in which the liquid layer 230 is evaporated such that the electrode 242 is bound to and is in electrical contact with the conductive pad 220. In some embodiments, the evaporation of the liquid layer 230 is achieved by raising a temperature of the conductive pad 220. After the liquid layer 230 is evaporated, the electrode 242 is stuck to the conductive pad 220. Specifically, the electrode 242 of the micro device 240 is bound to and in electrical contact with the conductive pad 220. As such, the micro device 240 can be kept in place to facilitate a following process (e.g., a bonding process).

Besides the liquid layer assisted binding, the material used in the electrode 242 and the conductive pad 220 can enhance solidity of binding. Specifically, since indium is used in both the electrode 242 and the conductive pad 220, and both sides of an interface between the electrode 242 and the conductive pad 220 are made of indium, when combined with said liquid layer 230 forming and said evaporation processes, a micro cold binding is formed after the electrode 242 is brought into contact with the conductive pad 220, which enhances solidity and reliability of the liquid layer 230 assisted binding between the micro device 240 and the conductive pad 220. In other words, with an introduction of indium as an interface material between the electrode 242 and the conductive pad 220, the liquid layer 230 assisted binding can be stronger, which facilitates various processes after binding. It is noted that if there is no liquid layer 230 assisted binding, the micro cold binding may not be easily formed merely by two similar metals. The "micro" means it is especially useful for a micro device 240 having the lateral length less than about 100 μm. When the micro device 240 is too large in its lateral length, the capillary force of the liquid layer 230 may be difficult to grip the micro device 240, thus the difficulty in forming the binding and the cold binding is increased.

Figure 3A:
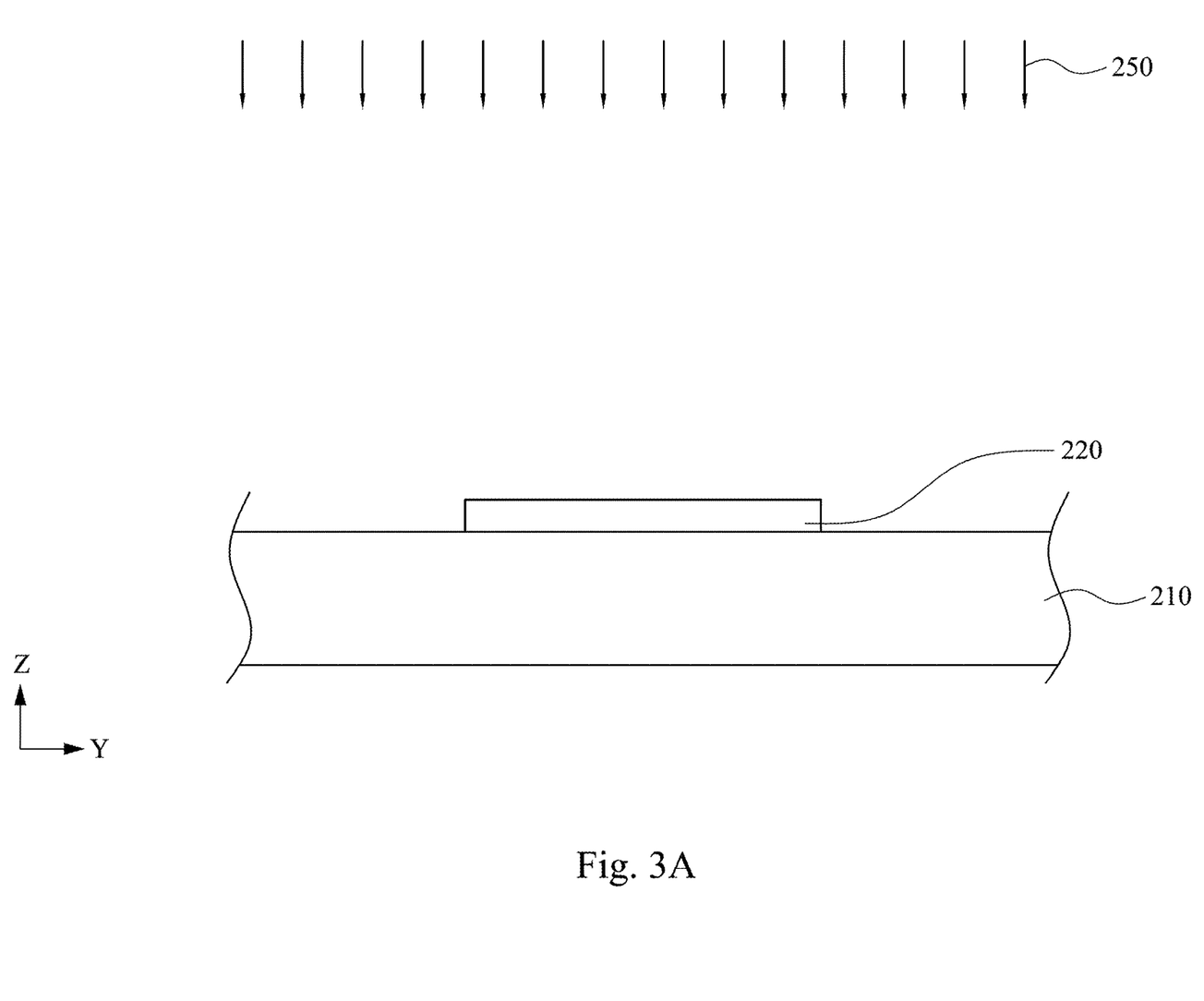
FIG. 3A is a schematic cross-sectional view of an alternative intermediate stage of the method according to some embodiments of the present disclosure.
Figure 3B:
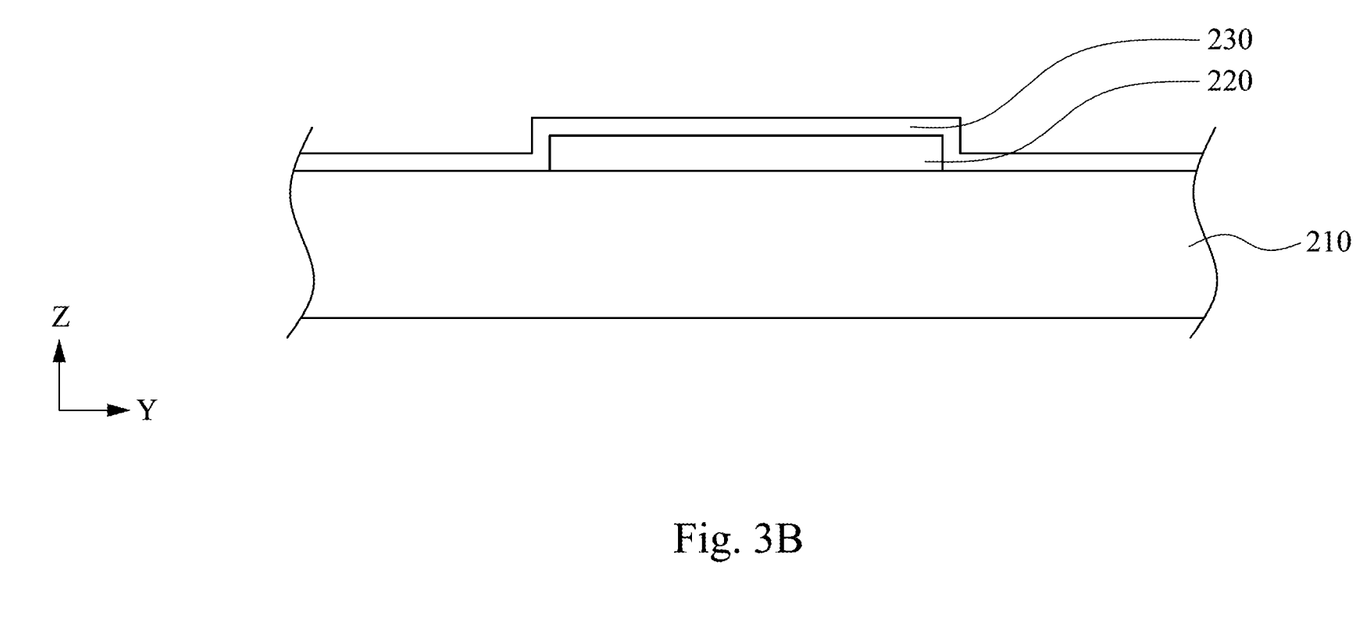
FIG. 3B is a schematic cross-sectional view of an alternative intermediate stage of the method according to some embodiments of the present disclosure.

The liquid layer 230 can be formed by different methods. FIGS. 3A and 3B are schematic cross-sectional views of alternative intermediate stages of the method 100 according to some embodiments of the present disclosure. In some embodiments as shown in FIGS. 3A and 3B, a gas 250 is locally showered on the substrate 210 such that a part of the gas 250 is condensed to form the liquid layer 230 on the substrate 210. In some embodiments, the gas 250 is condensed to form the liquid layer 230 on the conductive pad 220 as shown in FIG. 3B. In some embodiments, the gas 250 has a water vapor pressure higher than an ambient water vapor pressure, so as to spontaneously form the liquid layer 230 after showering. In some embodiments, the gas 250 consists essentially of water and nitrogen, but should not completely exclude other compounds or elements. The gas 250 can also form the liquid layer 230 after adjusting the temperature of the substrate 210 to the dew point when the water vapor pressure of the gas 250 initially showered is lower than the ambient water vapor pressure.

Figure 4:
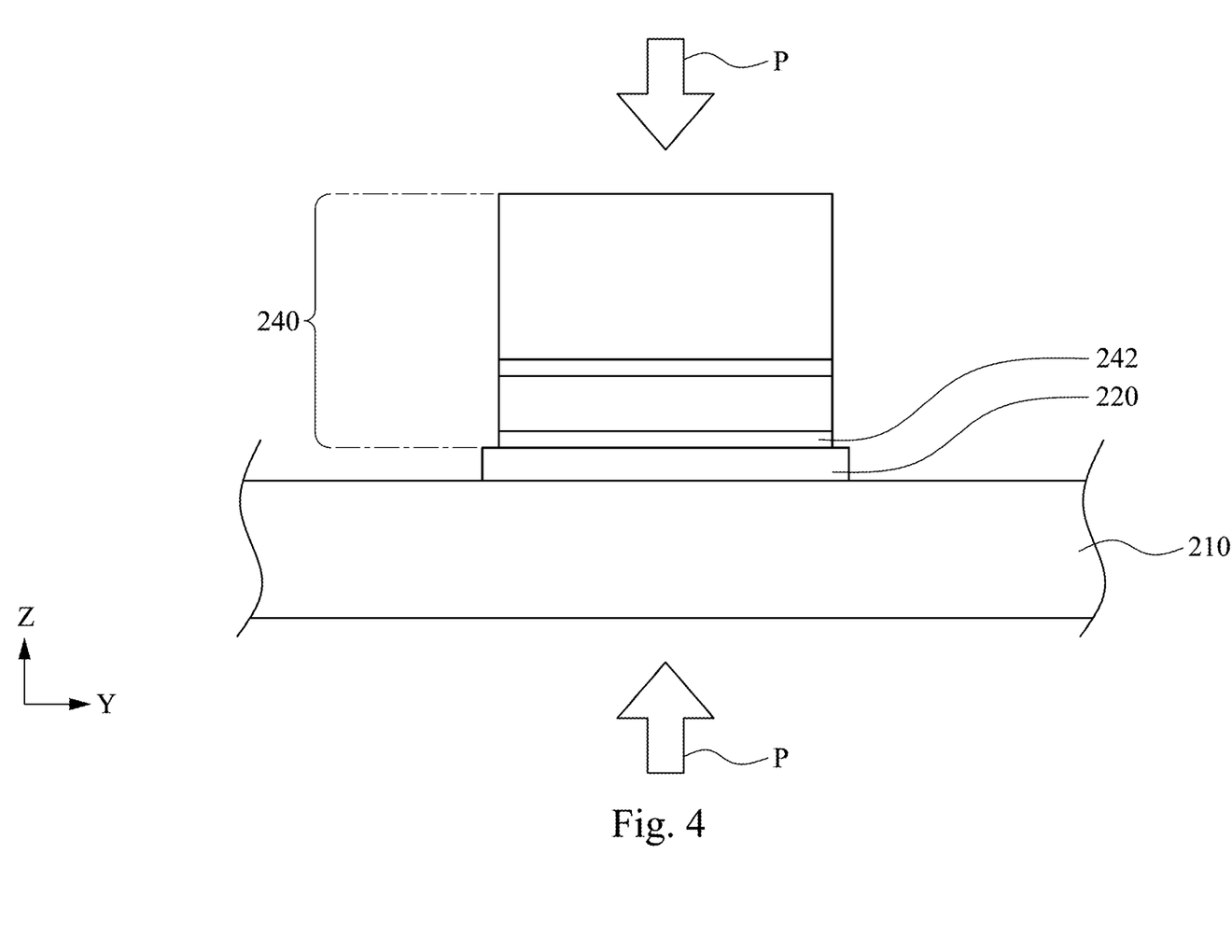
FIG. 4 is a schematic cross-sectional view of an optional intermediate stage of the method according to some embodiments of the present disclosure.

Reference is made to FIG. 4. FIG. 4 is a schematic cross-sectional view of an optional intermediate stage of the method 100 according to some embodiments of the present disclosure. In some embodiments, an external pressure P is applied to press the electrode 242 and the conductive pad 220 after the liquid layer 230 is evaporated, such that the electrode 242 is bonded to the conductive pad 220 by cold welding which specifically occurs between two similar metals brought into contact and pressed by the external pressure P. A bonding formed by said cold welding is especially strong between two indium surfaces brought into contact. The external pressure P can be applied by an additional plate (e.g., a flat plate) placed on the micro device 240, or changing the environmental pressure to press the micro device 240 and the conductive pad 220, but should not be limited thereto. Specifically, the external pressure P with a value less than or equal to about 1 atmospheric pressure (atm) can be applied to the micro device 240 within a space (e.g., a chamber) having the environmental pressure with a value about 0.1 torr (about $10^{-4}$ atm).

In some other embodiments, after the electrode 242 is bound to the conductive pad 220, a temperature of the conductive pad 220 is raised to be a temperature point below a melting point of indium but enough to bond the electrode 242 to the conductive pad 220. After that, the conductive pad 220 can be optionally cooled to solidify the bonding.

Figure 5:
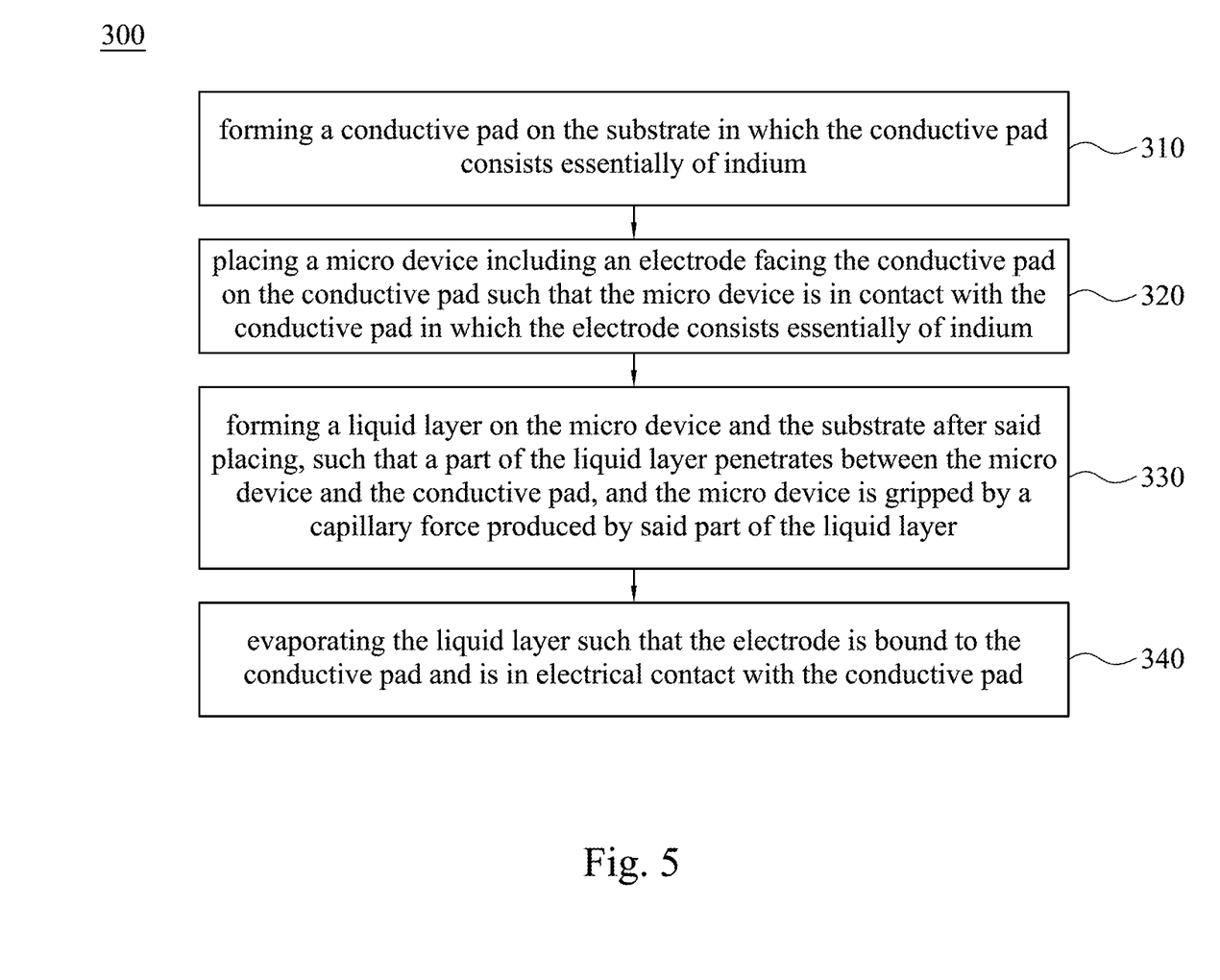
FIG. 5 is a flow chart of another method of liquid assisted micro cold binding according to some embodiments of the present disclosure.
Figure 6A:
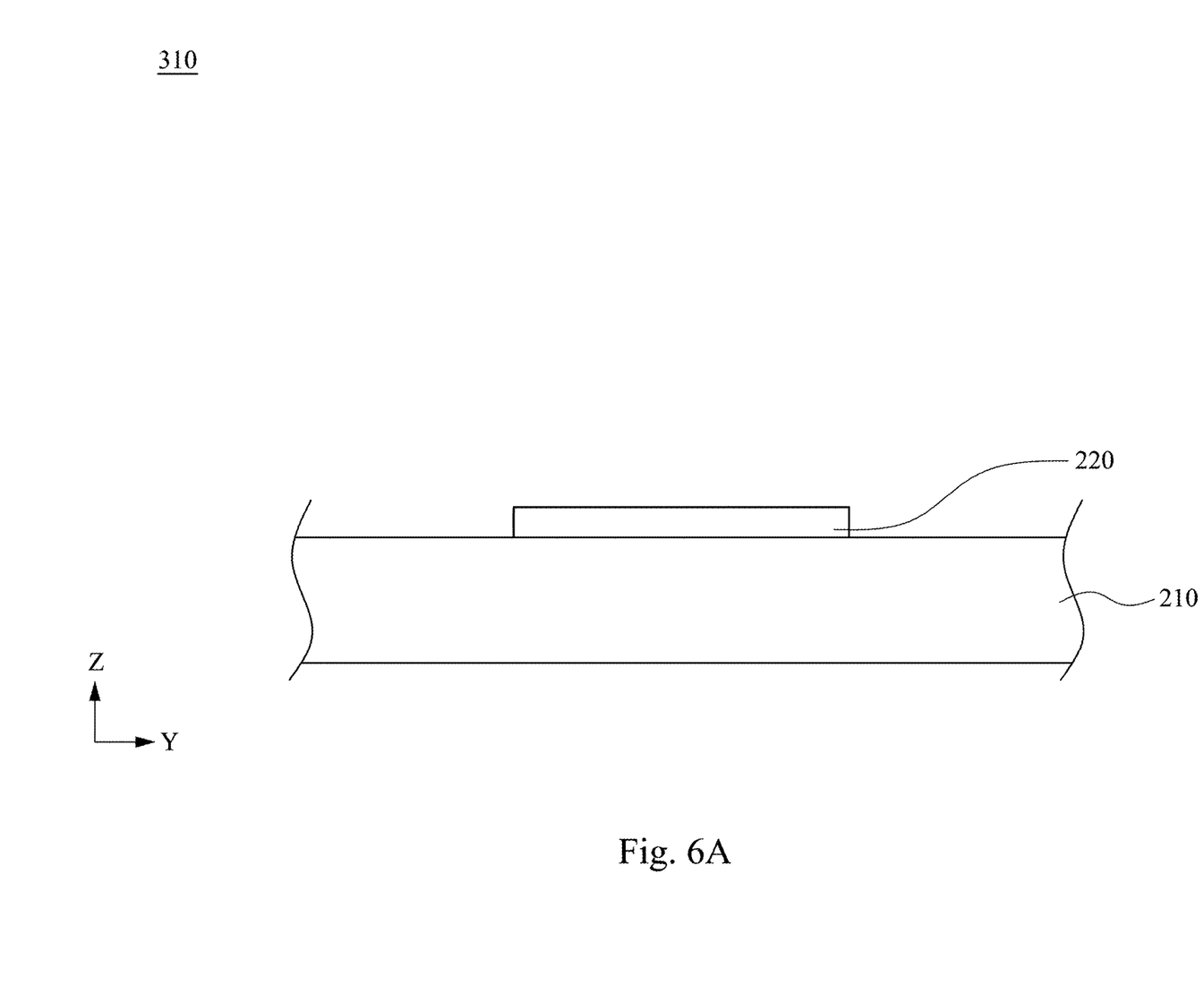
FIG. 6A is a schematic cross-sectional view of an intermediate stage of the another method according to one embodiment of the present disclosure.
Figure 6B:
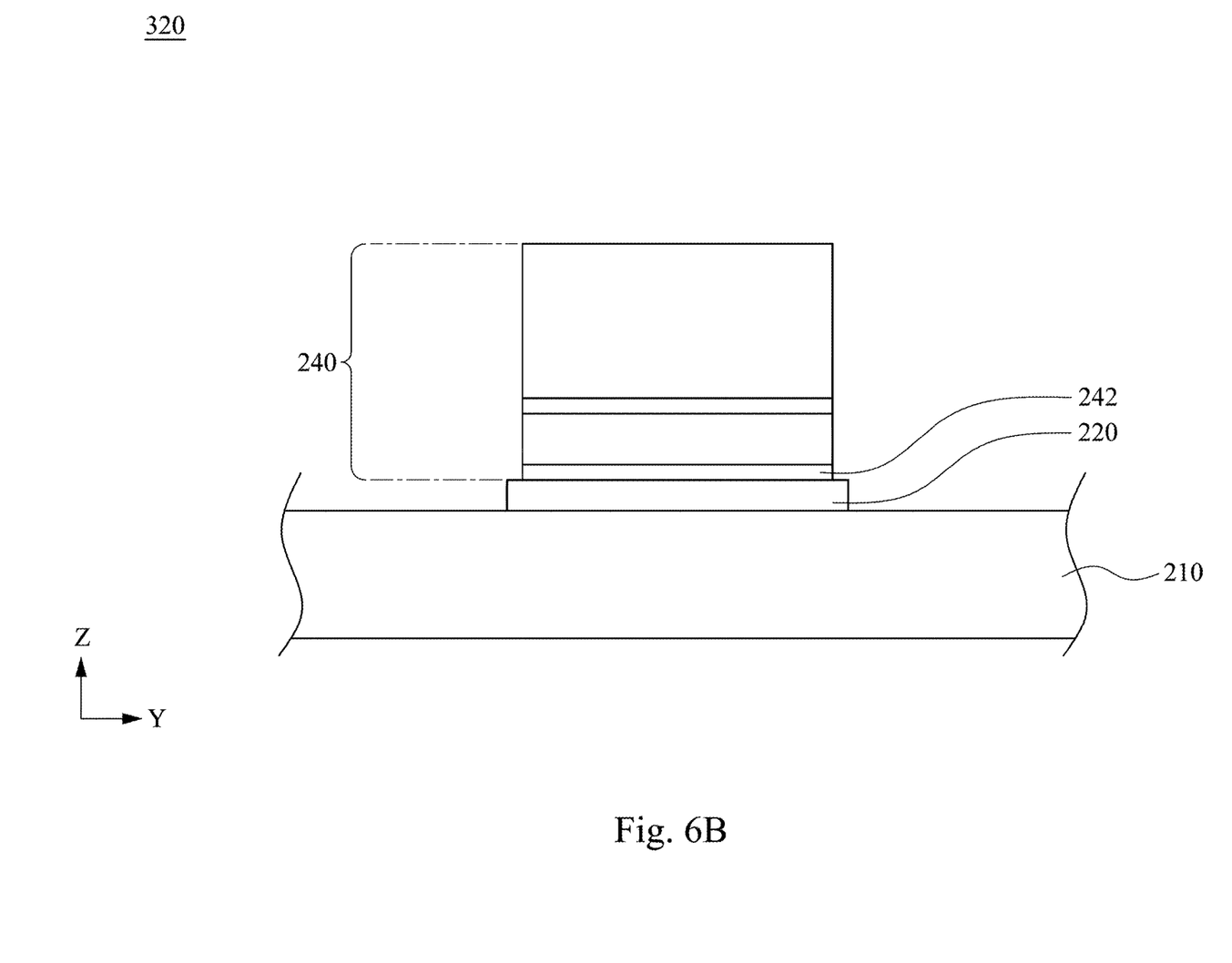
FIG. 6B is a schematic cross-sectional view of an intermediate stage of the another method according to one embodiment of the present disclosure.
Figure 6C:
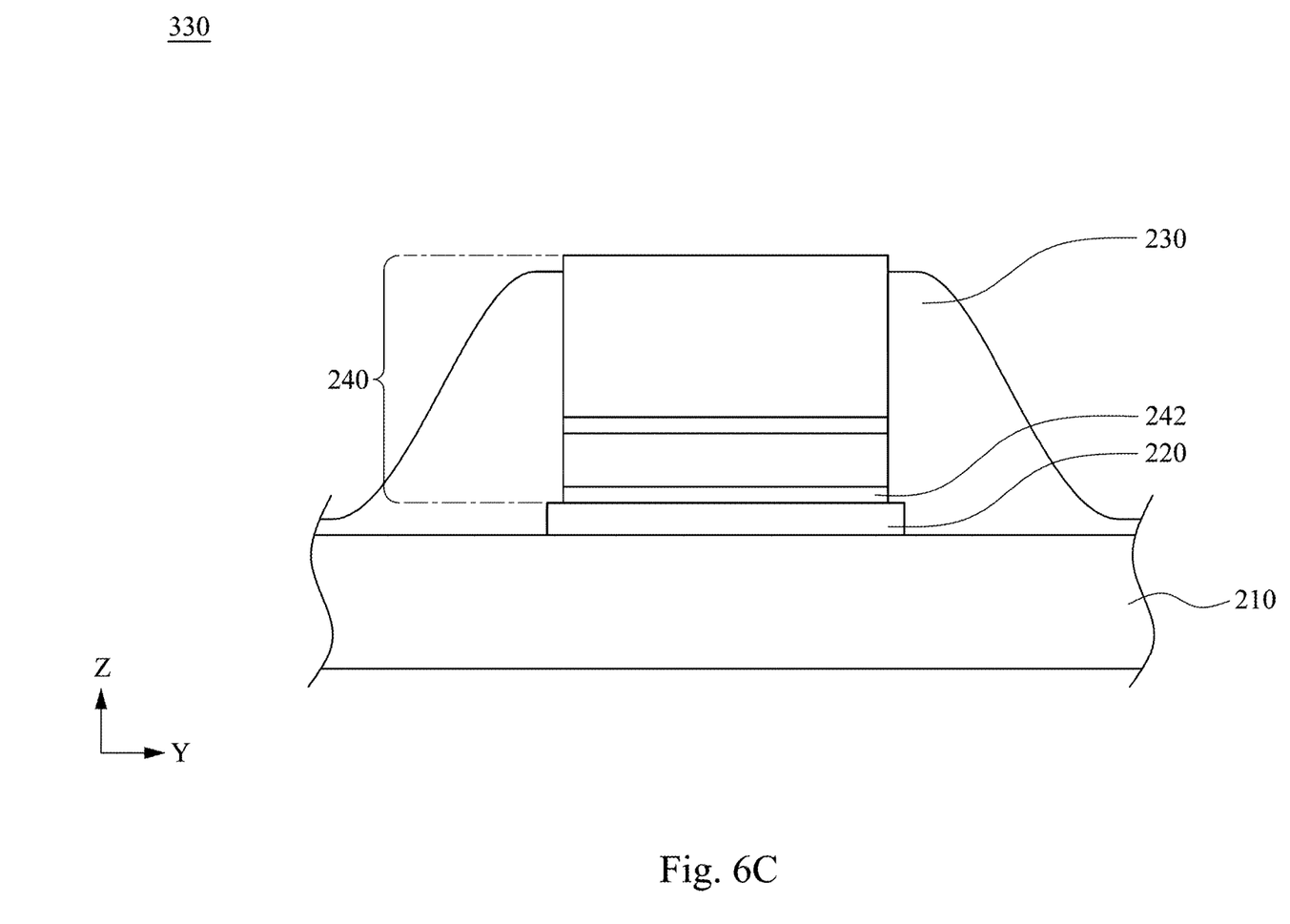
FIG. 6C is a schematic cross-sectional view of an intermediate stage of the another method according to one embodiment of the present disclosure.
Figure 6D:
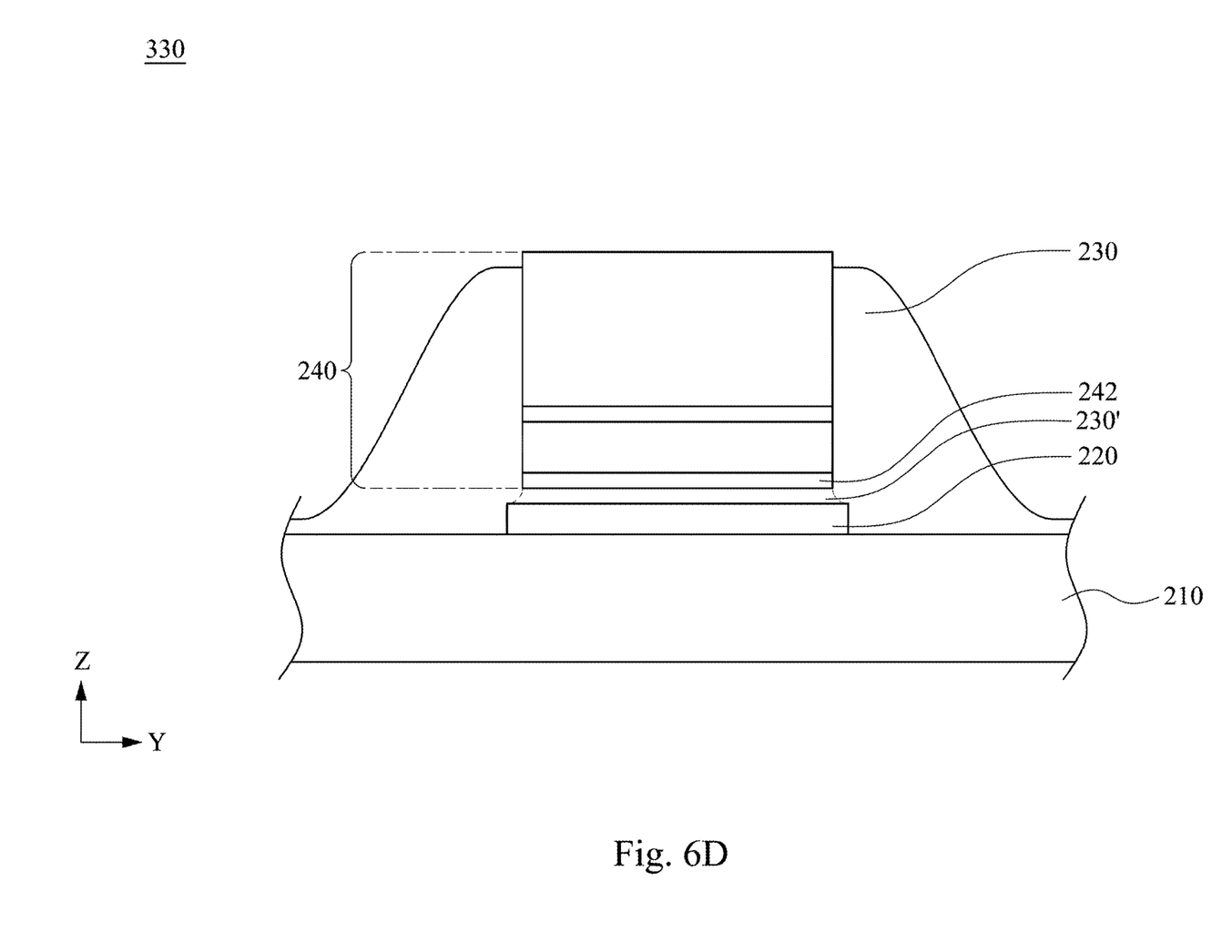
FIG. 6D is a schematic cross-sectional view of an intermediate stage of the another method according to one embodiment of the present disclosure.
Figure 6E:
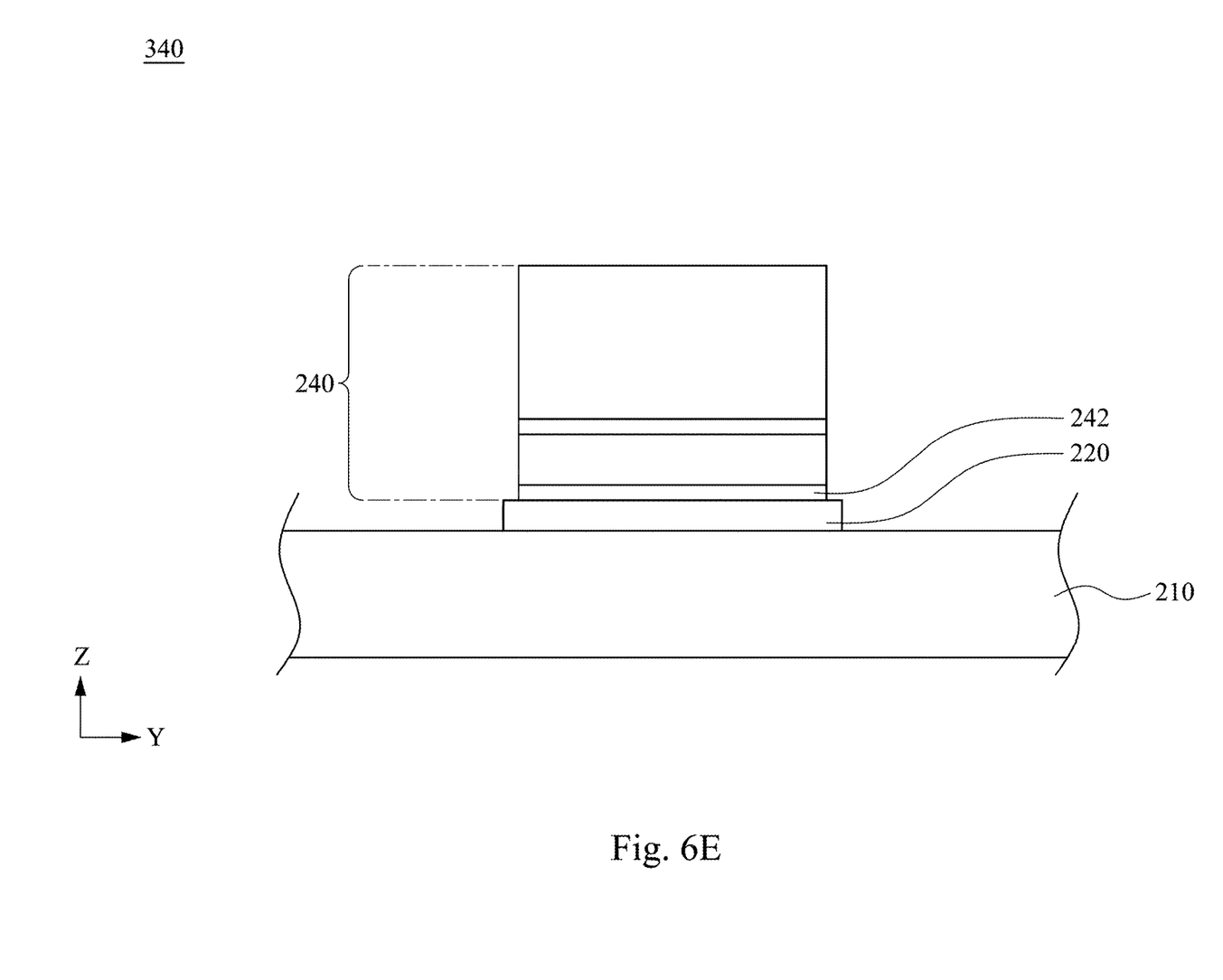
FIG. 6E is a schematic cross-sectional view of an intermediate stage of the another method according to one embodiment of the present disclosure.

Reference is made to FIGS. 5 to 6E. FIG. 5 is a flow chart of a method 300 of liquid assisted micro cold binding according to some embodiments of the present disclosure. FIGS. 6A to 6E are schematic cross-sectional views of intermediate stages of the method of FIG. 5. The method begins with operation 310 in which a conductive pad 220 is formed on a substrate 210 (as referred to FIG. 6A). The method continues with operation 320 in which a micro device 240 including an electrode 242 facing the conductive pad 242 is placed on the conductive pad 220 such that the micro device 240 is in contact with the conductive pad 220 (as referred to FIG. 6B). The method continues with operation 330 in which a liquid layer 230 is formed on the micro device 240 and the substrate 210 after the micro device 240 is placed on the conductive pad 220, such that a part 230' of the liquid layer 230 penetrates between the micro device 240 and the conductive pad 220 (as referred to FIGS. 6C and 6D). The method continues with operations 340 in which the liquid layer 230 is evaporated (as referred to FIG. 6E). The conductive pad 220 consists essentially of indium. The electrode 242 consists essentially of indium.

In some embodiments as shown in FIGS. 6C and 6D, the formation of the liquid layer 230 is achieved by adjusting a temperature of the conductive pad 220 in an environment including a vapor to a selected temperature point such that a part of the vapor is condensed to form the liquid layer 230 on the substrate 210. A part 230' of the liquid layer 230 surrounding the micro device 240 penetrates between the micro device 240 and the conductive pad 220, and the micro device 240 is gripped by a capillary force produced by said part 230' of the liquid layer 230.

Figure 7:
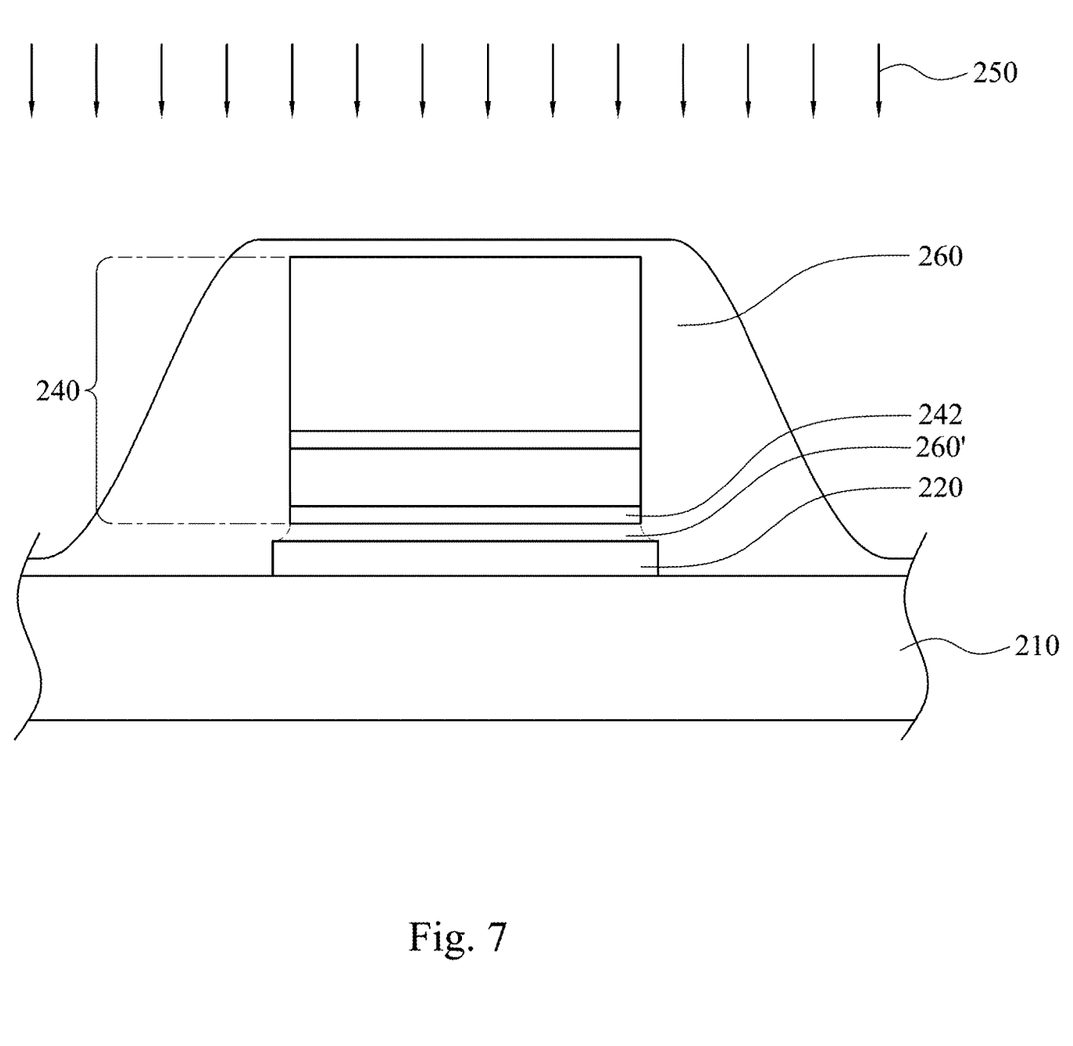
FIG. 7 is a schematic cross-sectional view of an alternative intermediate stage of the another method according to some embodiments of the present disclosure.

A liquid layer can be formed by different methods. FIG. 7 is a schematic view of an alternative intermediate stage of the method 300 according to some embodiments of the present disclosure. In some embodiments, the gas 250 is locally showered on the substrate 210 such that a part of the gas 250 is condensed to form the liquid layer 260 on the substrate 210. A part 260' of the liquid layer 260 surrounding the micro device 240 penetrates between the micro device 240 and the conductive pad 220.

Contents which are similar to the showering embodiments mentioned above will not be repeated herein again. In addition, contents related to raising the temperature of the conductive pad 220 to be below a melting point of indium after evaporating the liquid layer 260 and contents related to applying an external pressure P to press the electrode 242 and the conductive pad 220 which are similar to the embodiments mentioned above are also omitted herein.

In some other embodiments, another liquid layer is formed on the substrate 210 after the micro device 240 is placed over the conductive pad 220 (e.g., after operation 130 as shown in FIG. 2C). Then the another liquid layer and the liquid layer 230 are evaporated. As such, the binding can be further strengthened.

In some other embodiments, forming the conductive pad 220 is forming at least two conductive pads 220. One micro device 240 may include at least two electrodes 242, and the at least two electrodes 242 are separated from each other and respectively bound to the at least two conductive pads 220.

The scenarios illustrated in FIGS. 1 to 7 can be adopted to many kinds of micro devices, such as a flip chip type light-emitting diode, a vertical type light-emitting diode, or a vertical-cavity surface-emitting laser (VCSEL), and should not be limited thereto. The term "vertical" herein means the electrode electrically connected to the first type semiconductor layer and the electrode electrically connected to the second type semiconductor layer are placed on opposite sides of the micro device.

In summary, a method of liquid assisted micro cold binding is provided with an assistance of a synergetic combination of a liquid layer and indium acting as materials on both sides of an interface between a micro device and a conductive pad on a substrate. As such, solidity and reliability of binding are enhanced and thus facilitate various processes performed after binding.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this invention provided they fall within the scope of the following claims.

What is claimed is:

1. A method of liquid assisted micro cold binding, comprising:
    forming a conductive pad on the substrate, wherein the conductive pad consists essentially of indium;
    forming a liquid layer on the conductive pad;
    placing a micro device comprising an electrode facing the conductive pad over the conductive pad such that the micro device is in contact with the liquid layer and is gripped by a capillary force produced by the liquid layer between the micro device and the conductive pad, wherein the electrode consists essentially of indium; and
    evaporating the liquid layer such that the electrode is bound to the conductive pad and is in electrical contact with the conductive pad.

2. The method of claim 1, wherein forming the liquid layer further comprises:
    adjusting a temperature of the conductive pad in an environment comprising a vapor to a selected temperature point such that a part of the vapor is condensed to form the liquid layer on the conductive pad.

3. The method of claim 2, wherein the selected temperature point is a dew point.

4. The method of claim 1, wherein forming the liquid layer comprises:
showering a gas on the conductive pad and the substrate such that at least a part of the gas is condensed to form the liquid layer on the conductive pad and the substrate.

5. The method of claim 4, wherein the gas has a water vapor pressure higher than an ambient water vapor pressure.

6. The method of claim 1, wherein the liquid layer comprises water.

7. The method of claim 1, further comprising:
raising a temperature of the conductive pad to be below a melting point of indium after evaporating the liquid layer.

8. The method of claim 1, further comprising:
applying an external pressure to press the electrode and the conductive pad, such that the electrode is bonded to the conductive pad.

9. The method of claim 1, wherein a thickness of the part of the liquid layer between the electrode and the conductive pad is less than a thickness of the micro device when the micro device is gripped by the capillary force.

10. The method of claim 1, wherein a lateral length of the micro device is less than or equal to about 100 μm.

11. A method of liquid assisted micro cold binding, comprising:
forming a conductive pad on a substrate, wherein the conductive pad consists essentially of indium;
placing a micro device comprising an electrode facing the conductive pad on the conductive pad such that the micro device is in contact with the conductive pad in which the electrode consists essentially of indium;
forming a liquid layer on the micro device and the substrate after said placing, such that a part of the liquid layer penetrates between the micro device and the conductive pad, and the micro device is gripped by a capillary force produced by said part of the liquid layer; and
evaporating the liquid layer such that the electrode is bound to the conductive pad and is in electrical contact with the conductive pad.

12. The method of claim 11, wherein forming the liquid layer further comprises:
adjusting a temperature of the substrate in an environment comprising a vapor to a selected temperature point such that a part of the vapor is condensed to form the liquid layer on the substrate.

13. The method of claim 12, wherein the selected temperature point is a dew point.

14. The method of claim 11, wherein forming the liquid layer comprises:
showering a gas on the micro device and the substrate such that at least a part of the gas is condensed to form the liquid layer on the substrate and surrounding the micro device.

15. The method of claim 14, wherein the gas has a water vapor pressure higher than an ambient water vapor pressure.

16. The method of claim 11, wherein the liquid layer comprises water.

17. The method of claim 11, further comprising:
raising a temperature of the conductive pad to be below a melting point of indium after evaporating the liquid layer.

18. The method of claim 11, further comprising:
applying an external pressure to press the electrode and the conductive pad, such that the electrode is bonded to the conductive pad.

19. The method of claim 11, wherein a thickness of the part of the liquid layer between the electrode and the conductive pad is less than a thickness of the micro device when the micro device is gripped by the capillary force.

20. The method of claim 11, wherein a lateral length of the micro device is less than or equal to about 100 μm.

* * * * *